US012757416B2

(12) United States Patent
Chen et al.

(10) Patent No.: US 12,757,416 B2
(45) Date of Patent: Oct. 6, 2026

(54) METAL-OXIDE-SEMICONDUCTOR CAPACITOR STRUCTURE

(71) Applicant: UNITED MICROELECTRONICS CORP., Hsin-Chu City (TW)

(72) Inventors: Pin-Tseng Chen, Kaohsiung City (TW); Ling-Chun Chou, Tainan City (TW); Kun-Hsien Lee, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 368 days.

(21) Appl. No.: 18/380,641

(22) Filed: Oct. 16, 2023

(65) Prior Publication Data

US 2025/0107114 A1 Mar. 27, 2025

(30) Foreign Application Priority Data

Sep. 21, 2023 (TW) ................................ 112136045

(51) Int. Cl.
*H10D 62/10* (2025.01)
*H10D 1/66* (2025.01)

(52) U.S. Cl.
CPC ........... *H10D 1/665* (2025.01); *H10D 62/114* (2025.01)

(58) Field of Classification Search
None
See application file for complete search history.

(56) References Cited

U.S. PATENT DOCUMENTS 6,466,489 B1 * 10/2002 Ieong et al. .......... H02M 3/073 257/404
10,062,704 B2 * 8/2018 Chiu ...................... H10B 41/42
10,991,688 B2 * 4/2021 Liang ................. H10D 84/0144
2008/0061347 A1 * 3/2008 Mallikararjunaswamy ................ H10B 41/10 257/314
2013/0221418 A1 * 8/2013 Mitchell ................ H10D 1/692 257/E21.409

* cited by examiner

*Primary Examiner* — Cory W Eskridge
(74) *Attorney, Agent, or Firm* — Winston Hsu

(57) ABSTRACT

The invention provides a metal oxide semiconductor (MOS) capacitor structure, which includes a counter-doping region in the channel region directly below the gate. Between the deep ion well and the counter-doping region is a semiconductor region. The doping concentration of the semiconductor region is lower than that of the deep ion well. The P-type well ion implantation processes in the active region of the device can be omitted, so the production cost is lower, and the dosage of the counter-doping region can be reduced, which improves the time-dependent dielectric collapse (TDDB) issue.

20 Claims, 2 Drawing Sheets

METAL-OXIDE-SEMICONDUCTOR CAPACITOR STRUCTURE

BACKGROUND OF THE INVENTION

1. Field of the Invention

The present invention relates to the field of semiconductor technology, and in particular to an improved metal oxide semiconductor (MOS) capacitor structure.

2. Description of the Prior Art

Metal oxide semiconductor (MOS) capacitors are composed of semiconductor substrate, insulating film and gate. In the existing technology, the MOS capacitor manufacturing process usually requires the use of a hard mask for forming the MOS capacitors in combination with two P-well ion implantation steps and one counter doping step. Therefore, the process cost of the prior art method is high and the time dependent dielectric breakdown (TDDB) of the MOS capacitor is not satisfactory.

SUMMARY OF THE INVENTION

It is one object of the present invention to provide an improved MOS capacitor structure to solve the deficiencies or shortcomings of the prior art.

One aspect of the invention provides a metal-oxide-semiconductor (MOS) capacitor structure including a substrate having a first conductivity type; a first trench isolation structure disposed in the substrate and surrounding an active area of the substrate; a source region disposed in the active area; a drain region disposed in the active area and spaced apart from the source region, wherein the source region and the drain region have a second conductivity type; a channel region disposed between the source region and the drain region; a counter doping region disposed in the channel region, wherein the counter doping region has the second conductivity type; a deep ion well disposed in the substrate under the channel region, wherein the deep ion well has the second conductivity type; a first semiconductor region between the deep ion well and the counter doping region and directly under the counter doping region; a gate disposed over the channel region; and a gate dielectric layer disposed between the gate and the channel region, wherein a doping concentration of the first semiconductor region is lower than a doping concentration of the deep ion well.

According to some embodiments, the first semiconductor region comprises dopants having the first conductivity type and dopants having the second conductivity type.

According to some embodiments, the MOS capacitor further includes a spacer disposed on a sidewall of the gate.

According to some embodiments, the MOS capacitor further includes a lightly doped drain (LDD) region disposed in the substrate and directly under the spacer, wherein the LDD region has the second conductivity type.

According to some embodiments, the counter doping region overlaps with the LDD region.

According to some embodiments, the counter doping region overlaps with the LDD region, the source region, and the drain region.

According to some embodiments, the MOS capacitor further includes a second trench isolation structure disposed in the substrate and surrounding the first trench isolation structure; and a first pick-up doping region disposed in the substrate between the first trench isolation structure and the second trench isolation structure, wherein the first pick-up doping region has the first conductivity type.

According to some embodiments, the MOS capacitor further includes a third trench isolation structure disposed in the substrate and around the second trench isolation structure; a second pick-up doping region disposed in the substrate between the second trench isolation structure and the third trench isolation structure, wherein the second pick-up doping region has the second conductivity type; and an ion well disposed in the substrate between the second pick-up doping region and the deep ion well, wherein the ion well has the second conductivity type.

According to some embodiments, a second semiconductor region is disposed between the deep ion well and the source region and between the deep ion well and the drain region.

According to some embodiments, the first conductivity type is P type and the second conductivity type is N type.

Another aspect of the invention provides a metal-oxide-semiconductor (MOS) capacitor including a substrate having a first conductivity type; a first trench isolation structure disposed in the substrate and surrounding an active area of the substrate; a source region disposed in the active area; a drain region disposed in the active area and spaced apart from the source region, wherein the source region and the drain region have a second conductivity type; a channel region disposed between the source region and the drain region; a counter doping region disposed in the channel region, wherein the counter doping region has the second conductivity type; a deep ion well disposed in the substrate directly under the channel region, wherein the deep ion well has the second conductivity type; a first semiconductor region between the deep ion well and the counter doping region; a second semiconductor region disposed between the source region and the deep ion well and between the drain region and the deep ion well in the substrate, and wherein the second semiconductor region surrounds the first semiconductor region, wherein a doping concentration of the second semiconductor region is greater than a doping concentration of the first semiconductor region; a gate disposed over the channel region; and a gate dielectric layer disposed between the gate and the channel region, wherein the doping concentration of the first semiconductor region is lower than a doping concentration of the deep ion well.

According to some embodiments, the first semiconductor region has dopants having the first conductivity type and dopants having the second conductivity type.

According to some embodiments, the MOS capacitor further includes a spacer disposed on a sidewall of the gate.

According to some embodiments, the MOS capacitor further includes a lightly doped drain (LDD) region disposed in the substrate directly under the spacer, wherein the LDD region has the second conductivity type.

According to some embodiments, the counter doping region overlaps with the LDD region.

According to some embodiments, the counter doping region overlaps with the LDD region, the source region, and the drain region.

According to some embodiments, the MOS capacitor further includes a second trench isolation structure disposed in the substrate and surrounding the first trench isolation structure; and a first pick-up doping region disposed in the substrate between the first trench isolation structure and the second trench isolation structure, wherein the first pick-up doping region has the first conductivity type, and wherein the second semiconductor region is disposed between the first pick-up doping region and the deep ion well.

According to some embodiments, the MOS capacitor further includes a third trench isolation structure disposed in the substrate and around the second trench isolation structure; a second pick-up doping region disposed in the substrate between the second trench isolation structure and the third trench isolation structure, wherein the second pick-up doping region has the second conductivity type; and an ion well disposed in the substrate between the second pick-up doping region and the deep ion well, wherein the ion well has the second conductivity type.

According to some embodiments, the second semiconductor region is contiguous with the ion well.

According to some embodiments, the first conductivity type is P type and the second conductivity type is N type.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

In the semiconductor structures illustrated, there are two different conductivity types: P-type where the majority charge carriers are positively charged holes that typically migrate along the semiconductor valence band in the presence of an electric field, and N-type where the majority charge carriers are negatively charged electrons that typically migrate along the conduction band in the presence of an electric field. Dopants may be introduced into an intrinsic semiconductor to create one of the conductivity types. Heavily, medium, and lightly doped P-type materials are designated $P^+$, P and $P^-$, respectively, while heavily, medium, and lightly doped N-type materials are designated $N^+$, N and $N^-$, respectively.

Figure 1:
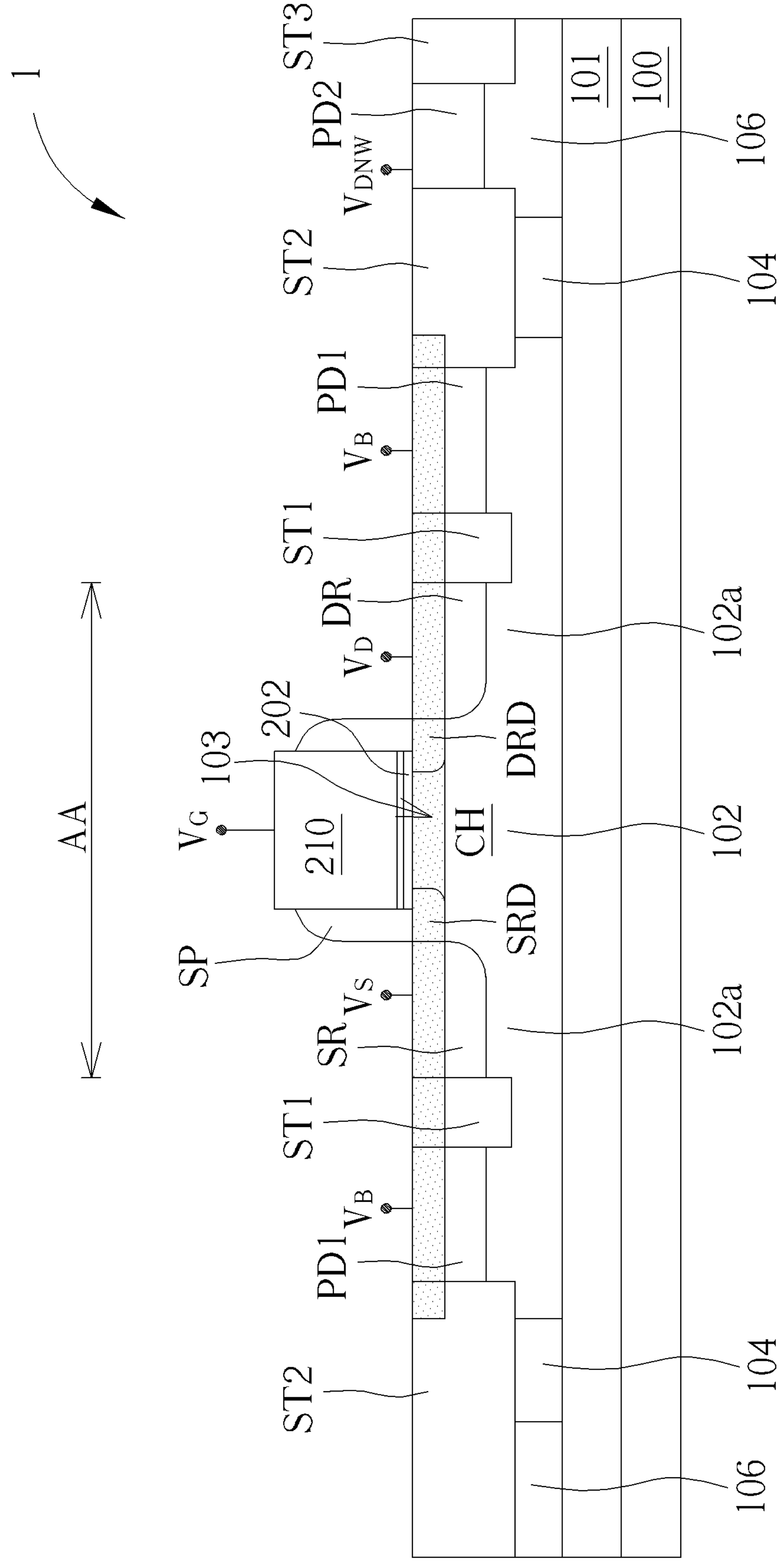
FIG. 1 is a schematic cross-sectional view of a metal oxide semiconductor capacitor structure according to an embodiment of the present invention.

Please refer to FIG. 1, which is a schematic cross-sectional view of a metal oxide semiconductor (MOS) capacitor structure according to an embodiment of the present invention. As shown in FIG. 1, the MOS capacitor structure 1 includes a substrate 100 of a first conductivity type, for example, a silicon substrate. A first trench isolation structure ST1 is provided in the substrate 100. The first trench isolation structure ST1 surrounds the active area AA of the substrate 100. A source region SR and a drain region DR are provided in the active area AA, where the drain region DR is spaced apart from the source region SR. The source region SR and the drain region DR have the second conductivity type. According to an embodiment of the present invention, the first conductivity type may be P type, and the second conductivity type may be N type. According to an embodiment of the present invention, for example, the substrate 100 may be a P-type silicon substrate, and the source region SR and the drain region DR may be $N^+$ doped regions. During operation, a low voltage $V_S$ is provided to the source region SR, and a low voltage $V_D$ is provided to the drain region DR.

According to an embodiment of the present invention, a channel region CH is formed between the source region SR and the drain region DR. According to an embodiment of the present invention, at least a counter-doping region 103 is provided in the channel region CH, wherein the counter-doping region 103 has a second conductivity type, for example, $N^+$ type. According to an embodiment of the present invention, a deep ion well 101 is provided in the substrate 100 below the channel region CH, where the deep ion well 101 has a second conductivity type, for example, N type.

According to an embodiment of the present invention, a first semiconductor region 102 is provided between the deep ion well 101 and the counter-doping region 103 and directly under the counter-doping region 103. According to an embodiment of the present invention, the doping concentration of the first semiconductor region 102 is lower than the doping concentration of the deep ion well 101. According to an embodiment of the present invention, the first semiconductor region 102 may have dopants of the first conductivity type and dopants of the second conductivity type.

According to an embodiment of the present invention, a gate 210 is disposed above the channel region CH, for example, a polysilicon gate or a metal gate. According to an embodiment of the present invention, a gate dielectric layer 202 is provided between the gate 210 and the channel region CH. The gate dielectric layer 202, for example, is a silicon dioxide layer, but is not limited thereto. During operation, a high voltage $V_G$ is provided to the gate 210.

According to an embodiment of the present invention, the MOS capacitor structure 1 further includes a spacer SP, which is disposed on the sidewall of the gate 210. According to an embodiment of the present invention, the MOS capacitor structure 1 further includes a lightly doped drain (LDD) region SRD and a lightly doped drain region DRD, which are disposed in the substrate 100 directly under the spacers SP, wherein the lightly doped drain region SRD and the lightly doped drain region DRD have the second conductivity type.

According to an embodiment of the present invention, the counter-doping region 103 overlaps the lightly doped drain region SRD and the lightly doped drain region DRD. According to an embodiment of the present invention, the counter-doping region 103 overlaps the lightly doped drain region SRD, the lightly doped drain region DRD, the source region SR, and the drain region DR.

According to an embodiment of the present invention, the MOS capacitor structure 1 further includes a second trench isolation structure ST2, which is disposed in the substrate 100 and surrounds the first trench isolation structure ST1. A first pick-up doping region PD1 is disposed in the substrate 100 between the first trench isolation structure ST1 and the second trench isolation structure ST2. According to an embodiment of the present invention, the first pick-up doping region PD1 has the first conductivity type, for example, $P^+$ type. During operation, a voltage $V_B$ is provided to the first pick-up doping region PD1, for example, $V_B$=0V.

According to an embodiment of the present invention, the MOS capacitor structure 1 further includes a third trench isolation structure ST3, which is disposed in the substrate 100 and surrounds the second trench isolation structure ST2. According to an embodiment of the present invention, the MOS capacitor structure 1 further includes a second pick-up doping region PD2 disposed in the substrate 100 between the second trench isolation structure ST2 and the third trench isolation structure ST3. According to an embodiment of the present invention, the second pick-up doping region PD2 has the second conductivity type, for example, $N^+$ type. During operation, the voltage $V_{DNW}$ is provided to the deep ion well 101 via the second pick-up doping region PD2, for example, $V_{DNW}$=VCC.

According to an embodiment of the present invention, the MOS capacitor structure 1 further includes an ion well 106, which is disposed in the substrate 100 between the second pick-up doping region PD2 and the deep ion well 101, wherein the ion well 106 has the second conductivity type, such as, N type. According to an embodiment of the present invention, the ion well 106 is an input/output (I/O) N-type well. According to an embodiment of the present invention, a second semiconductor region 102*a* is further provided between the deep ion well 101 and the source region SR and between the deep ion well 101 and the drain region DR. According to an embodiment of the present invention, the doping concentration of the second semiconductor region 102*a* is also lower than the doping concentration of the deep ion well 101. According to an embodiment of the present invention, the junction between the counter-doping region 103 and the first semiconductor region 102 is shallower than the junction between the source region SR and the second semiconductor region 102*a*. According to an embodiment of the present invention, the junction between the counter-doping region 103 and the first semiconductor region 102 is shallower than the junction between the drain region DR and the second semiconductor region 102*a*.

According to an embodiment of the present invention, the MOS capacitor structure 1 further includes an ion well 104, which is disposed in the substrate 100 between the second trench isolation structure ST2 and the deep ion well 101, wherein the ion well 104 has the first conductivity type, such as, P type. According to an embodiment of the present invention, the ion well 104 is an input/output (I/O) P-type well. According to an embodiment of the present invention, the ion well 104 does not extend directly below the first pickup doping region PD1.

Figure 2:
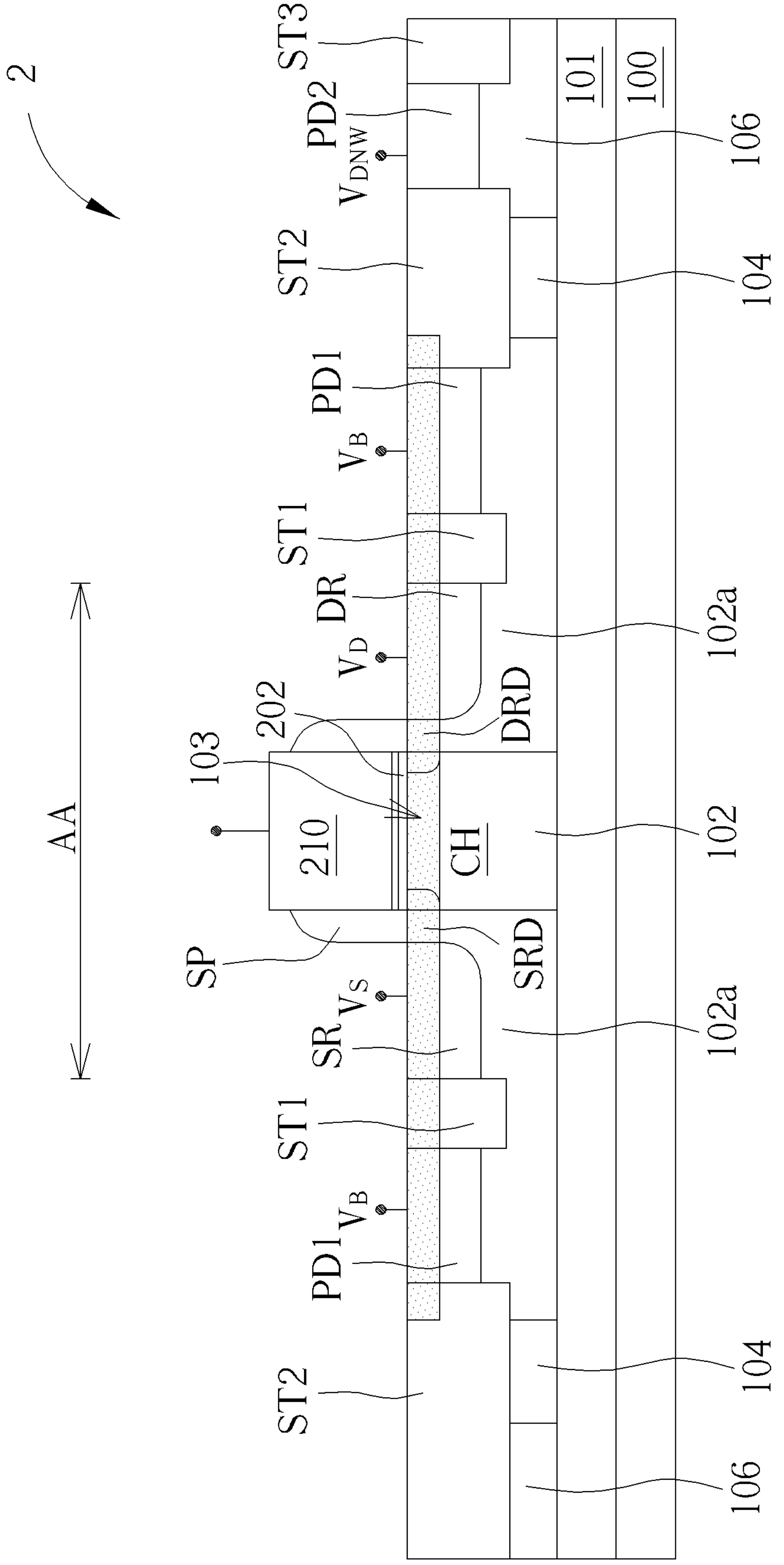
FIG. 2 is a schematic cross-sectional view of a metal oxide semiconductor capacitor structure according to another embodiment of the present invention.

Please refer to FIG. 2, which is a schematic cross-sectional view of a MOS capacitor structure according to another embodiment of the present invention. As shown in FIG. 2, likewise, the MOS capacitor structure 2 includes a substrate 100 having the first conductivity type, for example, a silicon substrate. A first trench isolation structure ST1 is provided in the substrate 100. The first trench isolation structure ST1 surrounds the active area AA of the substrate 100. A source region SR and a drain region DR are provided in the active area AA, wherein the drain region DR is spaced apart from the source region SR. The source region SR and the drain region DR have the second conductivity type. According to an embodiment of the present invention, the first conductivity type may be P type, and the second conductivity type may be N type. According to an embodiment of the present invention, for example, the substrate 100 may be a P-type silicon substrate, and the source region SR and the drain region DR may be $N^+$ doped regions. During operation, a low voltage $V_S$ is provided to the source region SR, and a low voltage $V_D$ is provided to the drain region DR.

According to an embodiment of the present invention, a channel region CH is provided between the source region SR and the drain region DR. According to an embodiment of the present invention, at least a counter-doping region 103 is provided in the channel region CH, wherein the counter-doping region 103 has the second conductivity type, for example, $N^+$ type. According to an embodiment of the present invention, a deep ion well 101 is provided in the substrate 100 below the channel region CH, wherein the deep ion well 101 has the second conductivity type, for example, N type. During operation, a voltage $V_{DNW}$ is provided to the deep ion well 101, for example, $V_{DNW}$=VCC.

According to an embodiment of the present invention, a first semiconductor region 102 is provided between the deep ion well 101 and the counter-doping region 103 and directly under the counter-doping region 103. According to an embodiment of the present invention, the doping concentration of the first semiconductor region 102 is lower than the doping concentration of the deep ion well 101. According to an embodiment of the present invention, the first semiconductor region 102 may have dopants of the first conductivity type and dopants of the second conductivity type.

According to an embodiment of the present invention, a gate 210 is disposed above the channel region CH, for example, a polysilicon gate or a metal gate. According to an embodiment of the present invention, a gate dielectric layer 202 is provided between the gate 210 and the channel region CH, for example, a silicon dioxide layer, but is not limited thereto. During operation, a high voltage $V_G$ is provided to the gate 210.

According to an embodiment of the present invention, the MOS capacitor structure 2 further includes a spacer SP, which is disposed on the sidewall of the gate 210. According to an embodiment of the present invention, the MOS capacitor structure 2 further includes a lightly doped drain region SRD and a lightly doped drain region DRD, which are disposed in the substrate 100 directly under the spacers SP, wherein the lightly doped drain region SRD and the lightly doped drain region DRD have the second conductivity type.

According to an embodiment of the present invention, the counter-doping region 103 overlaps the lightly doped drain region SRD and the lightly doped drain region DRD. According to an embodiment of the present invention, the counter-doping region 103 overlaps the lightly doped drain region SRD, the lightly doped drain region DRD, the source region SR, and the drain region DR.

According to an embodiment of the present invention, the MOS capacitor structure 2 further includes a second trench isolation structure ST2, which is disposed in the substrate 100 and surrounds the first trench isolation structure ST1. A first pick-up doping region PD1 is disposed in the substrate 100 between the first trench isolation structure ST1 and the second trench isolation structure ST2. According to an embodiment of the present invention, the first pick-up doping region PD1 has the first conductivity type, for example, $P^+$ type.

According to an embodiment of the present invention, the MOS capacitor structure 2 further includes a third trench isolation structure ST3, which is disposed in the substrate 100 and surrounds the second trench isolation structure ST2. According to an embodiment of the present invention, the MOS capacitor structure 2 further includes a second pick-up doping region PD2, which is disposed in the substrate 100 between the second trench isolation structure ST2 and the third trench isolation structure ST3. According to an embodiment of the present invention, the second pick-up doping region PD2 has the second conductivity type, for example, $N^+$ type.

According to an embodiment of the present invention, the MOS capacitor structure 2 further includes an ion well 106, which is disposed in the substrate 100 between the second pick-up doping region PD2 and the deep ion well 101, wherein the ion well 106 has the second conductivity type, such as, N type. According to an embodiment of the present invention, the ion well 106 is an input/output (I/O) N-type well. According to an embodiment of the present invention, a second semiconductor region 102*a* is further provided between the deep ion well 101 and the source region SR and between the deep ion well 101 and the drain region DR. The second semiconductor region 120*a* surrounds the first semiconductor region 120. The second semiconductor region 120*a* is also disposed between the first pick-up doping region PD1 and the deep ion well 101. According to an embodiment of the present invention, the doping concentration of the second semiconductor region 102*a* is greater than the doping concentration of the first semiconductor region 102.

According to an embodiment of the present invention, the MOS capacitor structure 1 further includes a third trench isolation structure ST3, which is disposed in the substrate 100 and surrounds the second trench isolation structure ST2. According to an embodiment of the present invention, the MOS capacitor structure 1 further includes a second pick-up doping region PD2, which is disposed in the substrate 100 between the second trench isolation structure ST2 and the third trench isolation structure ST3. According to an embodiment of the present invention, the second pick-up doping region PD2 has the second conductivity type, for example, $N^+$ type.

According to an embodiment of the present invention, the MOS capacitor structure 1 further includes an ion well 106, which is disposed in the substrate 100 between the second pick-up doping region PD2 and the deep ion well 101, wherein the ion well 106 has the second conductivity type, such as, N type. According to an embodiment of the present invention, the ion well 106 is an input/output (I/O) N-type well. According to an embodiment of the present invention, a second semiconductor region 102*a* is further provided between the deep ion well 101 and the source region SR and between the deep ion well 101 and the drain region DR. The second semiconductor region 120*a* surrounds the first semiconductor region 120. The second semiconductor region 120*a* is also disposed between the first pick-up doping region PD1 and the deep ion well 101. According to an embodiment of the present invention, the doping concentration of the second semiconductor region 102*a* is greater than the doping concentration of the first semiconductor region 102.

According to an embodiment of the present invention, the MOS capacitor structure 1 further includes an ion well 104, which is disposed in the substrate 100 between the second trench isolation structure ST2 and the deep ion well 101, wherein the ion well 104 has the first conductivity type, such as, P type. According to an embodiment of the present invention, the ion well 104 is an input/output (I/O) P-type well. For example, the second semiconductor region 102*a* may have the first conductivity type, for example, P type. The doping concentration of the second semiconductor region 102*a* may be equal to the doping concentration of the ion well 104, but is not limited thereto. According to an embodiment of the present invention, the second semiconductor region 102*a* can be regarded as an extension of the ion well 104. The second semiconductor region 102*a* can avoid leakage current between the deep ion well 101 and the source region SR or between the deep ion well 101 and the drain region DR during operation.

One advantage of the present invention is that the conventional two P-type well ion implantation steps are omitted in the active region AA, so the process cost is reduced, and the doping dose of the counter doping region 103 can be reduced, which improves the time-dependent dielectric breakdown (TDDB) issue of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal-oxide-semiconductor (MOS) capacitor structure, comprising:
   - a substrate having a first conductivity type;
   - a first trench isolation structure disposed in the substrate and surrounding an active area of the substrate;
   - a source region disposed in the active area;
   - a drain region disposed in the active area and spaced apart from the source region, wherein the source region and the drain region have a second conductivity type;
   - a channel region disposed between the source region and the drain region;
   - a counter doping region disposed in the channel region, wherein the counter doping region has the second conductivity type, wherein the counter doping region has a portion that overlaps with the source region and the drain region, and wherein a bottom of the source region and a bottom of the drain region are lower than a bottom of the portion of the counter doping region overlapping with the source region and the drain region;
   - a deep ion well disposed in the substrate under the channel region, wherein the deep ion well has the second conductivity type;
   - a first semiconductor region between the deep ion well and the counter doping region and directly under the counter doping region;
   - a gate disposed over the channel region; and
   - a gate dielectric layer disposed between the gate and the channel region;
   - wherein a doping concentration of the first semiconductor region is lower than a doping concentration of the deep ion well.

2. The MOS capacitor structure according to claim 1, wherein the first semiconductor region comprises dopants having the first conductivity type and dopants having the second conductivity type.

3. The MOS capacitor structure according to claim 1 further comprising:
   - a spacer disposed on a sidewall of the gate.

4. The MOS capacitor structure according to claim 3 further comprising:
   - a lightly doped drain (LDD) region disposed in the substrate and directly under the spacer, wherein the LDD region has the second conductivity type.

5. The MOS capacitor structure according to claim 4, wherein the counter doping region overlaps with the LDD region.

6. The MOS capacitor structure according to claim 4, wherein the counter doping region overlaps with the LDD region, the source region, and the drain region.

7. The MOS capacitor structure according to claim 1 further comprising:

a second trench isolation structure disposed in the substrate and surrounding the first trench isolation structure; and a first pick-up doping region disposed in the substrate between the first trench isolation structure and the second trench isolation structure, wherein the first pick-up doping region has the first conductivity type.

8. The MOS capacitor structure according to claim 7 further comprising:

a third trench isolation structure disposed in the substrate and around the second trench isolation structure;

a second pick-up doping region disposed in the substrate between the second trench isolation structure and the third trench isolation structure, wherein the second pick-up doping region has the second conductivity type; and an ion well disposed in the substrate between the second pick-up doping region and the deep ion well, wherein the ion well has the second conductivity type.

9. The MOS capacitor structure according to claim 1, wherein a second semiconductor region is disposed between the deep ion well and the source region and between the deep ion well and the drain region.

10. The MOS capacitor structure according to claim 1, wherein the first conductivity type is P type and the second conductivity type is N type.

11. A metal-oxide-semiconductor (MOS) capacitor structure, comprising:

a substrate having a first conductivity type;

a first trench isolation structure disposed in the substrate and surrounding an active area of the substrate;

a source region disposed in the active area;

a drain region disposed in the active area and spaced apart from the source region, wherein the source region and the drain region have a second conductivity type;

a channel region disposed between the source region and the drain region;

a counter doping region disposed in the channel region, wherein the counter doping region has the second conductivity type, wherein the counter doping region has a portion that overlaps with the source region and the drain region, and wherein a bottom of the source region and a bottom of the drain region are lower than a bottom of the portion of the counter doping region overlapping with the source region and the drain region;

a deep ion well disposed in the substrate directly under the channel region, wherein the deep ion well has the second conductivity type;

a first semiconductor region between the deep ion well and the counter doping region;

a second semiconductor region disposed between the source region and the deep ion well and between the drain region and the deep ion well in the substrate, and wherein the second semiconductor region surrounds the first semiconductor region, wherein a doping concentration of the second semiconductor region is greater than a doping concentration of the first semiconductor region;

a gate disposed over the channel region; and a gate dielectric layer disposed between the gate and the channel region;

wherein the doping concentration of the first semiconductor region is lower than a doping concentration of the deep ion well.

12. The MOS capacitor structure according to claim 11, wherein the first semiconductor region has dopants having the first conductivity type and dopants having the second conductivity type.

13. The MOS capacitor structure according to claim 11 further comprising:

a spacer disposed on a sidewall of the gate.

14. The MOS capacitor structure according to claim 13 further comprising:

a lightly doped drain (LDD) region disposed in the substrate directly under the spacer, wherein the LDD region has the second conductivity type.

15. The MOS capacitor structure according to claim 14, wherein the counter doping region overlaps with the LDD region.

16. The MOS capacitor structure according to claim 14, wherein the counter doping region overlaps with the LDD region, the source region, and the drain region.

17. The MOS capacitor structure according to claim 11 further comprising:

a second trench isolation structure disposed in the substrate and surrounding the first trench isolation structure; and a first pick-up doping region disposed in the substrate between the first trench isolation structure and the second trench isolation structure, wherein the first pick-up doping region has the first conductivity type, and wherein the second semiconductor region is disposed between the first pick-up doping region and the deep ion well.

18. The MOS capacitor structure according to claim 17 further comprising:

a third trench isolation structure disposed in the substrate and around the second trench isolation structure;

a second pick-up doping region disposed in the substrate between the second trench isolation structure and the third trench isolation structure, wherein the second pick-up doping region has the second conductivity type; and an ion well disposed in the substrate between the second pick-up doping region and the deep ion well, wherein the ion well has the second conductivity type.

19. The MOS capacitor structure according to claim 18, wherein the second semiconductor region is contiguous with the ion well.

20. The MOS capacitor structure according to claim 11, wherein the first conductivity type is P type and the second conductivity type is N type.

* * * * *